United States Patent
Guu et al.

(10) Patent No.: US 8,501,502 B2
(45) Date of Patent: Aug. 6, 2013

(54) PACKAGE METHOD FOR ELECTRONIC COMPONENTS BY THIN SUBSTRATE

(71) Applicant: Princo Middle East FZE, Dubai (AE)

(72) Inventors: Yeong-yan Guu, Hsinchu (TW); Ying-jer Shih, Hsinchu (TW)

(73) Assignee: Princo Middle East FZE, Dubai (AE)

( * ) Notice: Subject to any disclaimer, the term of this patent is extended or adjusted under 35 U.S.C. 154(b) by 0 days.

(21) Appl. No.: 13/665,950

(22) Filed: Nov. 1, 2012

(65) Prior Publication Data

US 2013/0171751 A1    Jul. 4, 2013

(30) Foreign Application Priority Data

Dec. 28, 2011   (TW) .............................. 100149376 A

(51) Int. Cl.
*H01L 21/66* (2006.01)

(52) U.S. Cl.
CPC .............. *H01L 22/12* (2013.01); *H01L 22/14* (2013.01)
USPC .............. 438/15; 438/17; 438/108; 438/121; 257/E21.524

(58) Field of Classification Search
USPC ...... 438/15, 17, 108, 121, 127; 257/E21.524
See application file for complete search history.

(56) References Cited

U.S. PATENT DOCUMENTS

| | | | |
|---|---|---|---|
| 6,159,767 A * | 12/2000 | Eichelberger | 438/107 |
| 7,046,022 B2 * | 5/2006 | Richmond et al. | 324/756.05 |
| 7,902,660 B1 * | 3/2011 | Lee et al. | 257/698 |
| 7,915,718 B2 * | 3/2011 | Lee et al. | 257/668 |
| 2008/0203268 A1 * | 8/2008 | Hobbs et al. | 248/678 |
| 2013/0106459 A1 * | 5/2013 | Tseng et al. | 324/759.01 |

* cited by examiner

*Primary Examiner* — Michael Trinh
(74) *Attorney, Agent, or Firm* — Mark M. Friedman

(57) ABSTRACT

Disclosed is a package method for electronic components by a thin substrate, comprising: providing a carrier; forming at least one metal layer and at least one dielectric layer on the carrier for manufacturing the thin substrate, and the thin substrate comprises at least one package unit for connecting at least one chip; forming at least one pad layer on a surface of the thin substrate; parting the thin substrate from the carrier; performing test to the thin substrate to weed out the package unit with defects in the at least one package unit and select the package units for connecting the chips; connecting the chips with the selected package units by flip chip bonding respectively. Accordingly, the yield of the entire package process can be improved and the pointless manufacture material cost can be reduced.

14 Claims, 10 Drawing Sheets

Prior Art

Prior Art

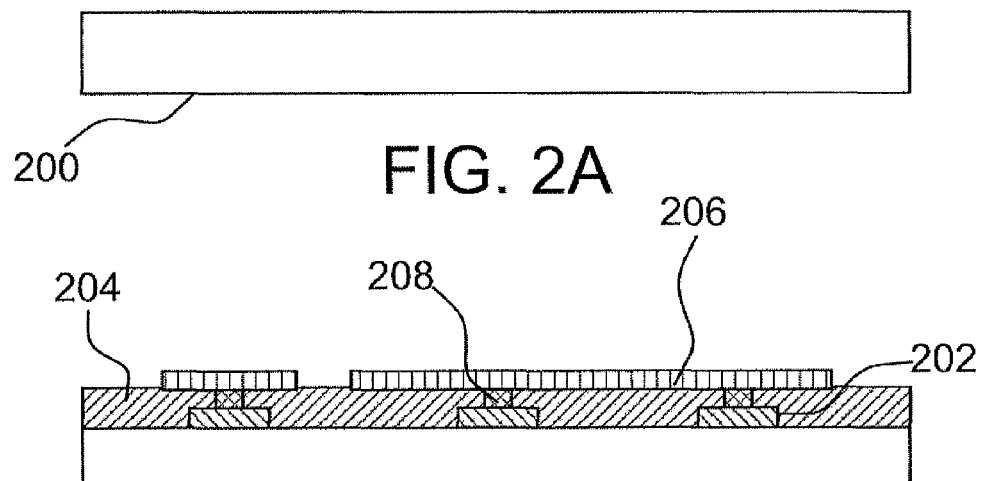
FIG. 2A
FIG. 2B
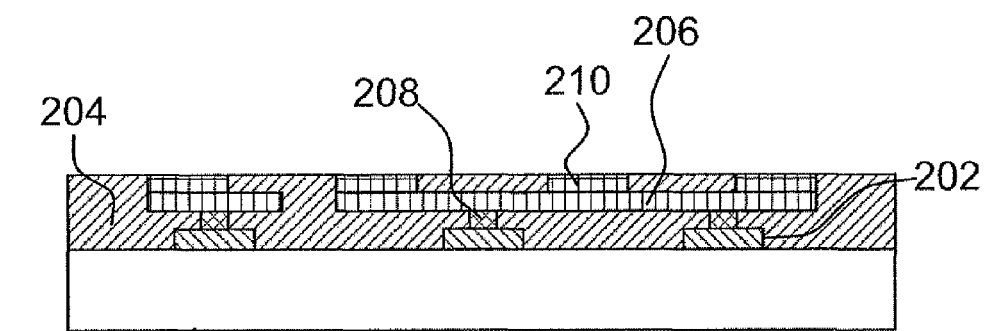
FIG. 2C
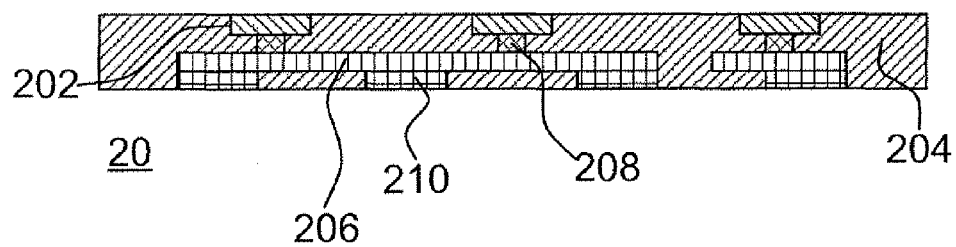
FIG. 2D

PACKAGE METHOD FOR ELECTRONIC COMPONENTS BY THIN SUBSTRATE

BACKGROUND OF THE INVENTION

1. Field of the Invention

The present invention generally relates to a package method for electronic components by a thin substrate, and more particularly to a wafer level package method of a ultra thin, high density package substrate employed for the complicated package multiple components integration.

2. Description of Prior Art

With rapid development of the integration of IC chips chasing after the Moore's Law, the relevant package skill has reached the unprecedented and innovative level than ever. In numerous innovative package skills, the WLP (Wafer Level Packaging) or CSP (Chip Scale Package) is one of the IC chip package and is also the most representative skill which is considered as a revolutionary skill. The biggest difference from the arts prior thereto is: the concept of the wafer level packaging is directly implemented on the silicon wafer to finish the package process of the integrated circuit rather than packaging respective IC chips after dicing the silicon wafer as previously implements in traditional package process. After the wafer level packaging, the sizes of the IC chips is almost the same as the original size of dies. Therefore, it is also well known as WLCSP (Wafer Level Chip Scale Package).

However, the size of the present WLP restricts the Fan-out area of the layout. Fan-out WLP is developed accordingly. For example, the eWLB (Embedded wafer level ball grid array) skill of Infinion, the SiWLP (System in Wafer-Level Package) or the SMAFTI (SMArt chip connection with Feed-Through Interposer) skill of Renasas can be illustrated.

Please refer to FIG. 1A to FIG. 1F which depict schematic diagrams of a wafer level package according to prior arts. The aforementioned Fan-out WLP in the field does not have any standard process. Kinds of relevant skills may slightly differ from each other but the basic skill concept is almost the same.

As shown in FIG. 1A, a temporary carrier 100 is provided. The temporary carrier 100 can be a silicon wafer in a wafer level package.

As shown in FIG. 1B, multiple layers which are formed on the temporary carrier 100 comprises lines of metal layers 102, 106 and dielectric layer 104. After the metal layers 102, 106 and the dielectric layer 104 are manufactured, the multi layers (i.e. the multi-layer substrate for packaging the IC chip) are completed. Only portion of the multi-layer substrate is shown in FIG. 1B for simplification. Practically, 3-5 layers or more can be formed.

As shown in FIG. 1C, several pad layers (ball pad layers) 108 are formed on the surface of the multi-layer substrate. The pad layers 108 are connected with the metal layer 106 thereunder with the via metals 110 as shown in FIG. 1C.

As shown in FIG. 1D, the packages 112 are performed to the chip (bare die) 150 through the pad layers 108. The method of packages 112 can be well known Flip chip bump bonding MBB (micro bump bonding) or SMT BGA (Surface Mount Ball Grid Array) for illustrations.

As shown in FIG. 1E, then, molding 152 is performed to the bonded chips.

As shown in FIG. 1F, the BGA ball mounting 114 is performed to bottom surface of the multi-layer substrate the after the molded chip 150 and the multi-layer substrate is parted from the temporary carrier 100.

The WLP as aforementioned is merely simple description but the basic concept of the WLP is to manufacture the multi-layer substrate on the silicon wafer 100 and to package the chip 150. After the multi-layer substrate is parted from the temporary carrier 100, then the dice or singulation process is implemented to finish the package of the respective IC chip 150. However, the yield of the entire package process depends on the sum of the yields of respective components. For the WLP as aforementioned, the dice or singulation process cannot implement until the wafer molding to the whole silicon wafer is finished. Unavoidably, the defects in the multi-layer substrate can cause some individual IC chip failure but the IC chips with qualified package still cannot be selected until the dice or singulation process is done.

Moreover, the SMAFTI package method proposed by Renasas is utilized for packaging a memory chip with a SoC (System-On-a-Chip) or a logic chip as illustration.

First, manufacturing multiple layers (FTI, Feed-Through Interposer), i.e. an intermediate layer on a silicon wafer;
Implementing bonding to the memory chip;
performing a wafer molding to the whole wafer;
removing the silicon wafer;
implementing bonding to the SoC (System-On-a-Chip) or the logic chip through the FTI (Feed-Through Interposer). The package completed product (the packaged memory chip with the SoC or the logic chip) are connected to an external system circuit board (PCB) with a BGA.

The yield of the entire package process depends on the sum of the yields of respective components. In the foregoing case, that is: the yields of 1. the manufacture of the FTI (Feed-Through Interposer); 2. memory chip package; 3. the SoC package or the logic chip package.

In the aforesaid SMAFTI, the yield of the FTI (Feed-Through Interposer) is a major factor to affect the yield of the entire package process. Even a test is performed to the FTI (Feed-Through Interposer) in advance. The wafer molding cannot allow selectively implementing bonding or molding to individual IC chip. It obstructs the yield improvement of the entire package process and especially the main reason to increase the pointless manufacture material cost.

Moreover, the aforesaid WLP skill is limited to perform flip chip bonding to one kind of bare die. In this field, there is no total solution specifically proposed for a thin and flexible multi-layer substrate of integrally packaging multiple elements. Beside, in the aforesaid WLP, the multi-layer substrate is used for packaging the SoC or the logic chip first. Then, another side of the chip which is connected with a ball grid array is employed to connect the external system circuit (PCB) and the whole package process is finished thereby. Under the condition that the complexity and integration of the package process becomes higher, the package processes utilizing a flexible multi-layer substrate are constantly developed and reveals more possibility of the development related with the package process. It is has been considered as the package skill in the next generation. Once the foregoing concept of wafer level package according to prior arts remains to be adopted, the drawbacks of impossibility for performing pre test to the FTI (Feed-Through Interposer) still exist consequently. The complete test cannot be realized accordingly. The benefits of the wafer level package process utilizing a flexible multi-layer substrate for integrally packaging multiple elements cannot but conducted and the package yield which is desperate for improvement in the prior arts cannot be eliminated and lasts.

Consequently, there is a need to develop a total solution for the package process of a thin substrate which is specific for the test, the packages, the molding and respective processes for completing the final products and to provide a package method and a test method of a thin substrate.

SUMMARY OF THE INVENTION

An objective of the present invention is to provide a package method for electronic components by a thin substrate. The method is capable of performing pre test to the thin substrate and applicable to the package process with extreme complexity and high integration. Not merely the yield of the entire package process can be improved but also the pointless manufacture material cost can be efficiently reduced further.

The package method for electronic components by a thin substrate according to the first embodiment of the present invention comprises steps of: providing a carrier;
forming at least one metal layer and at least one dielectric layer on the carrier for manufacturing the thin substrate, and the thin substrate comprises at least one package unit for connecting at least one chip;
forming at least one pad layer on a surface of the thin substrate;
parting the thin substrate from the carrier;
performing test to the thin substrate to weed out the package unit with defects in the at least one package unit and select the package units for connecting the chips;
connecting the chips with the selected package units by flip chip bonding respectively; and
performing an entire molding to the chips which are flip chip bonded on the thin substrate to build the electronic components.

The package method for electronic components by a thin substrate according to the second embodiment of the present invention comprises steps of:
providing a carrier;
forming at least one metal layer and at least one dielectric layer on the carrier for manufacturing the thin substrate, and the thin substrate comprises at least one package unit for connecting at least one chip;
forming at least one pad layer on a surface of the thin substrate;
parting the thin substrate from the carrier;
performing test to the thin substrate to weed out the package unit with defects in the at least one package unit and select the package units for connecting the chips;
connecting the chips with the selected package units by flip chip bonding;
dicing the thin substrate according to a molding panel size; and
performing a molding to the chips which are flip chip bonded on molding panels to build the electronic components.

The package method for electronic components by a thin substrate according to the third embodiment of the present invention comprises steps of:
providing a carrier;
forming at least one metal layer and at least one dielectric layer on the carrier for manufacturing the thin substrate, and the thin substrate comprises at least one package unit for connecting at least one chip;
forming at least one pad layer on a surface of the thin substrate;
parting the thin substrate from the carrier;
performing test to the thin substrate to weed out the package unit with defects in the at least one package unit and select the package units for connecting the chips; dicing the thin substrate according to a molding panel size to select the package units for connecting the chips;
connecting the chips with the selected package units by flip chip bonding; and
performing a molding to the chips which are flip chip bonded on molding panels to build the electronic components.

The package method for electronic components by a thin substrate according to the fourth embodiment of the present invention comprises steps of:
providing a carrier;
forming at least one metal layer and at least one dielectric layer on the carrier for manufacturing the thin substrate, and the thin substrate comprises at least one package unit for connecting at least one chip;
forming at least one pad layer on a surface of the thin substrate;
parting the thin substrate from the carrier;
performing test to the thin substrate to weed out the package unit with defects in the at least one package unit and select the package units for connecting the chips;
connecting the chips with the selected package units by flip chip bonding respectively; and
connecting the package units with a plurality of solder balls respectively to form ball grid arrays respectively.

The package method for electronic components by a thin substrate according to the fifth embodiment of the present invention comprises steps of:
providing a carrier;
forming at least one metal layer and at least one dielectric layer on the carrier for manufacturing the thin substrate, and the thin substrate comprises at least one package unit for connecting at least one chip;
forming at least one pad layer on a surface of the thin substrate;
parting the thin substrate from the carrier;
performing test to the thin substrate to weed out the package unit with defects in the at least one package unit and select the package units for connecting the chips;
dicing the thin substrate according to the package units to select the package units for connecting the chips;
reassembling the package units for connecting the chips according to a molding panel size and connecting the chips with the selected package units by flip chip bonding respectively;
performing a molding to the chips which are flip chip bonded on molding panels to build the electronic components.

According to the package method for electronic components by a thin substrate of the present invention, the pre test can be performed to the thin substrate. The package method is applicable to the package process with extreme complexity and high integration. Meanwhile, transfer molding is generally employed. In comparison with prior arts, the present invention has advantages of improving the yield of the entire package process and efficiently reducing the pointless manufacture material cost further.

BRIEF DESCRIPTION OF THE DRAWINGS

FIG. 2A to FIG. 2D depict schematic diagrams of first four steps of the package method for electronic components by a thin substrate according to the present invention.

DETAILED DESCRIPTION OF THE INVENTION

Figure 1A:
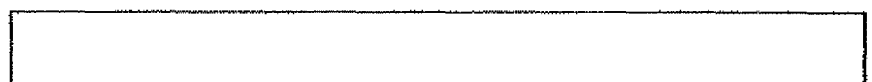
FIG. 1A to FIG. 1F depict schematic diagrams of a wafer level package according to prior arts.
Figure 1B:
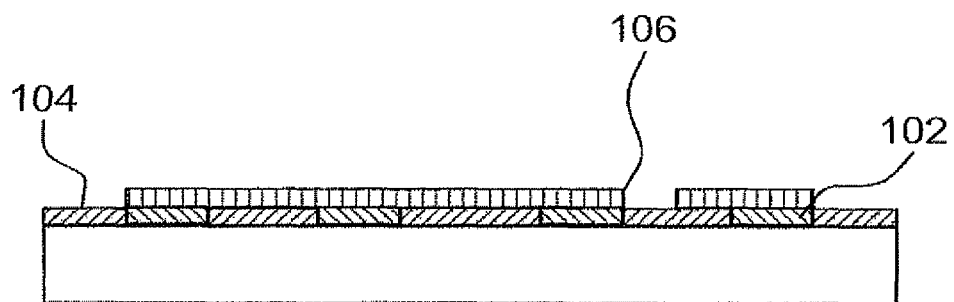
Figure 1C:
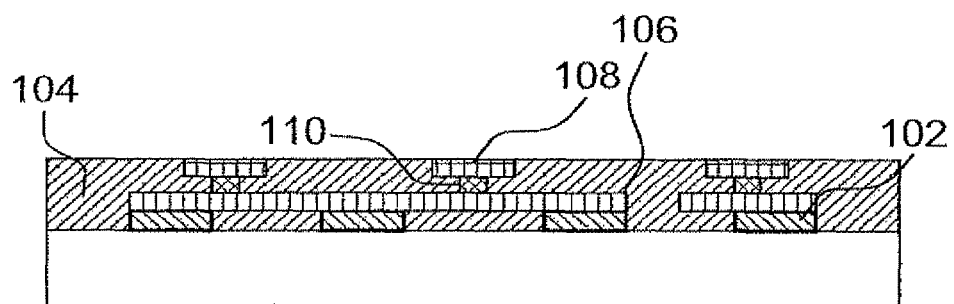

Please refer to FIG. 2A to FIG. 2D, which depict schematic diagrams of first four steps of the package method for electronic components by a thin substrate according to the present invention. As shown in FIG. 2A, a carrier 200 is provided. The carrier 200 can be a silicon wafer as an illustration for a wafer level package.

As shown in FIG. 2B, at least one metal layer and at least one dielectric layer are formed on the carrier 200, In this embodiment of the present invention, a plurality of metal layers 202, 206 and a plurality of dielectric layers 204 are alternately formed on the carrier 200 in order to manufacture the thin multi-layer substrate of the present invention. The thin substrate of the present invention comprises at least one package unit. One single package unit of the thin substrate is shown in figure for connecting one single IC chip. For example, the electrical wire lines figured by the metal layers 202, 206 can be formed by a metal lift off process and the dielectric layers 204 can be formed with polyimide. The metal layers 202, 206 and the dielectric layers 204 are formed to manufacture a multi-layer substrate (i.e. the thin substrate for connecting IC chips). The electrical wire lines figured by the metal layers 202, 206 are interconnected by via metals 208.

As shown in FIG. 2C, a plurality of pad layers (ball pads) 210 are formed on a surface of the thin substrate. As shown in FIG. 2D, after the completely manufactured thin substrate is parted from the carrier 100, the pad layers 210 (ball pads) are positioned downward for connecting the IC chips by flip chip bonding. Significantly, the metal layers 202 of the present invention also can be employed as pad layers. According to the present invention, the metal layers 202 can be employed to connect the IC chip, other packaged electronic device, passive element or external electrical circuit by flip chip bonding depending on demands of the circuit design. Comparing with prior arts, the package processes of the present invention contains excellent capability and the package circuit design can be nimbler according to the present invention.

Then, a complete yield test can be performed to the thin substrate to weed out and mark the package units with defects because the thin substrate has been parted from the carrier 100. The yield of the entire package process can be improved because the package units for connecting the chips can be selected and the package units with defects are weeded out.

As aforementioned, the yield test is performed after the thin substrate is completely manufactured and parted from the carrier 100. A thickness of the thin multi-layer substrate of the present invention is merely 30-200 µm, more preferably is 50-100 µm and the texture is very soft and flexible. Therefore, the test method is totally different from the test for the wafer level package device of prior arts. The wafer level package device of prior arts has steady form and structure and simply fixed to be tested by a common flying probe or a common probe card as well known.

Nevertheless, the objective of the test to the substrate is to find out the electric property defect which is a latent fault due to the two wires net short circuit, the wire net open circuit, the wire resistance offset and the wire line structure defect. The electric property test that the present invention is capable to perform comprises a capacitance test and a resistance test.

The capacitance test requires only one test junction. In the capacitance test, the capacitance of the measured wire net is compared with the capacitance of the proper wire net. The capacitance of the measured wire net is higher if the two wires net short circuit happened; the capacitance of the measured wire net is lower if the wire net open circuit happened. However, the drawback of the capacitance test is that the latent fault due to the wire resistance offset and the wire line structure defect cannot be measured.

The resistance test requires two test junctions. In the resistance test, the resistance of the measured wire net is compared with the resistance of the proper wire net. The resistance of the measured two wire net which should be open becomes resistive if the two wires net short circuit happened; the resistance of the measured wire net which should be resistive becomes open if the wire net open circuit happened; the offset value between the resistance of the measured wire net and the resistance of the normal wire net can be obtained if the wire resistance offset exists; the variation of the high frequency value can be detected by inputting a high frequency signal if the latent fault exists. That is: performing a completely test to improve the yield of the multi-layer substrate. In the wafer level package process according to prior arts, only one surface of the multi-layer substrate is uncovered after the multi-layer substrate is used to package bare dies. Under such circumstance, the capacitance test is the only choice when the independent test to the multi-layer substrate is required because the capacitance test requires only one junction. This is the reason why a complete and independent test does not and cannot be conducted to the multi-layer substrate in the wafer level package process according to prior arts in practice. Because for performing complete and independent test to the multi-layer substrate, the multi-layer substrate needs to be independent without connecting any components to be tested with two junctions. Only the resistance test can realize the foregoing complete test. Therefore, the present invention provides a package method for electronic components by a thin substrate herein.

Please refer to FIG. 3A to FIG. 3D, which depict schematic diagrams of performing a complete yield test with a probe card before the thin substrate of the present invention is packaged. As shown in the top view diagram of FIG. 3A and in the sectional view diagram of FIG. 3B, a clamp system 300 is required before the test is performed to the thin substrate 20 shown in FIG. 2D because thickness of the thin substrate of the present invention is merely 30-200 µm, more preferably is 50-100 µm and the texture is very soft and flexible as aforementioned. The clamp system 300 comprises a peripheral part 310, clamp parts 320, adjustment springs 330 and fixing screws 340. The peripheral part 310 is an instrument made in accordance with the shape of the thin substrate. The clamp parts 320 are employed to clamp edges of the thin substrate 20. The adjustment springs 330 can be employed for further adjusting the position of the thin substrate fixed in the peripheral part 310 precisely. With the adjustment springs 330 and the fixing screws 340, a proper tension to the thin substrate 20 can be provided for performing test with the proper tension.

Furthermore, the aforesaid tension requires to be controlled appropriately to maintain the contact resistance of the thin substrate 20 to be under 5 ohm, and preferably to be under 10 ohm when the test is performed. The clamp system 300 needs to apply a certain tension to the thin substrate 20. However, the tension to the thin substrate 20 should be 0~40,000 N/m, and preferably to be 0.1~1000 N/m. The restriction of the tension may change according to the thickness of the thin substrate 20 and Young's modules and the deformation should be less than 1000 ppm (the distance variation of each centimeter <10 μm) to allow the probes 401 of the probe card 400 reliably contact the pads 202 of the thin substrate 20. The objective of controlling the tension is not only to maintain the contact resistance of the thin substrate 20 to be under 5 ohm, and preferably to be under 10 ohm when the test is performed. More importantly, the irreversible deformation may happen and results in damages to the interior wires if the thin substrate 20 suffers the tension exceeding the aforesaid restriction. Moreover, probe marks are left on the surfaces of the pads 202 after testing the thin substrate 20. With different test methods and different pressing forces, the sizes of the probe marks are 5~50 μm and the depths thereof are 100 nm~3000 nm. For reliably contacting the pads 202 of the thin substrate 20, such probe marks are inevitable results in the test. Besides, it is easy to understand by observing the probe marks that as the probe mark is too small, the poor contact leads to test failure; as the probe mark is too big, the pad surface are damaged and the pore space on the connect surface appears. The poor connection happens in the following connecting process. Even an oxide may generate after the pad surface is damaged and the oxidized connecting surface causes the degradation of the connecting strength. Therefore, the aforesaid tension can be appropriately controlled according to the present invention to content the requirements of lots of technical aspects for the aforesaid electric property, the tension to the substrate, prevention of the pad surface damage and etc. during the test to the thin substrate.

Figure 3A:
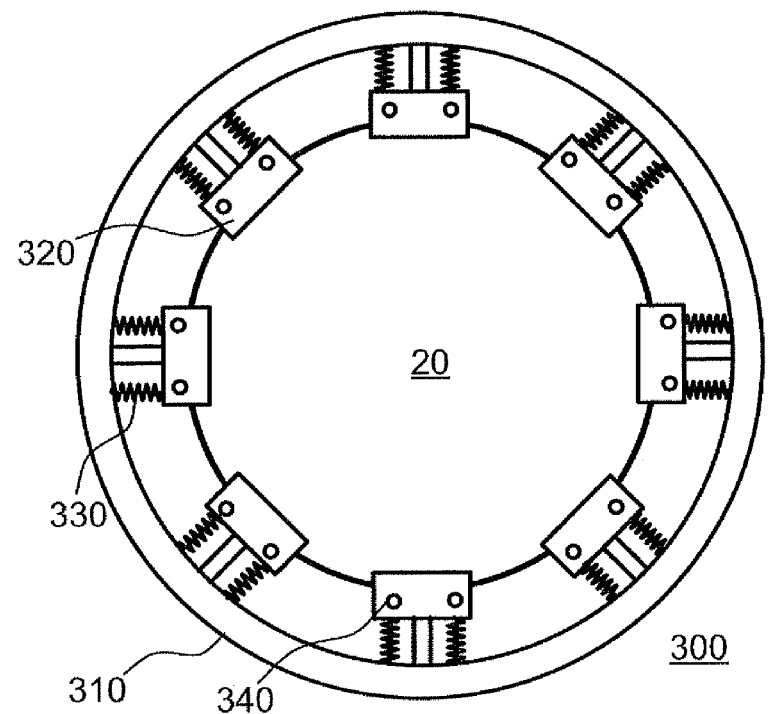
FIG. 3A to FIG. 3D depict schematic diagrams of performing test with a probe card before the thin substrate of the present invention is packaged.
Figure 3B:
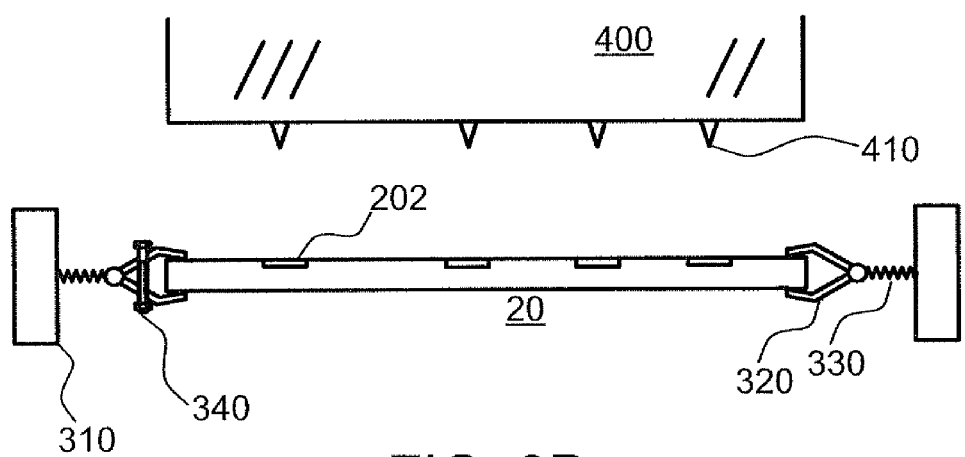
Figure 3C:
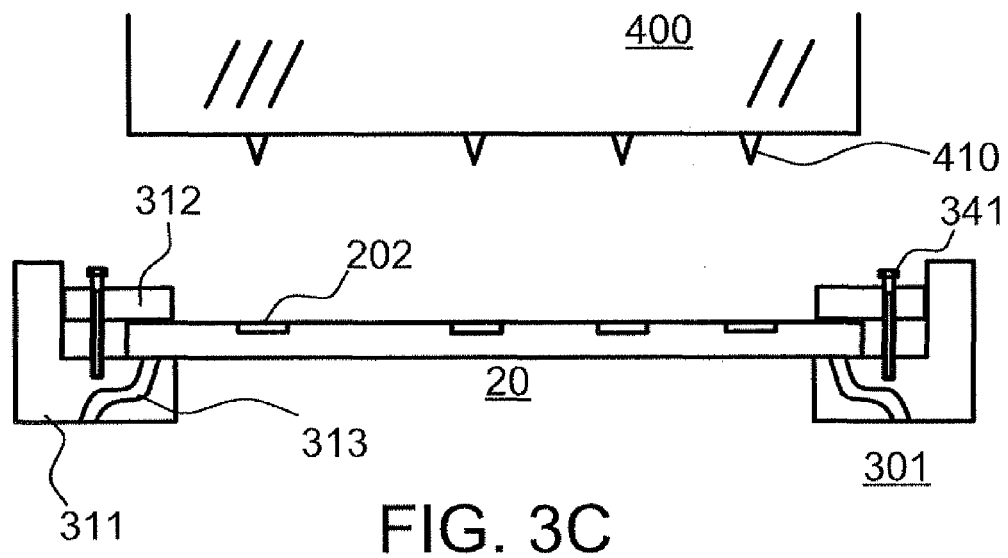

Furthermore, as shown in the sectional view diagram of FIG. 3C, which depicts another clamp system 301 employed in the present invention for clamping the thin substrate. The clamp system 301 comprises a lower holding plate 311, an upper holding plate 312 and fixing screws 341. The lower holding plate 311 comprises suction holes 313. The thin substrate 20 between the lower holding plate 311 and the upper holding plate 312 can be firmly fixed further with vacuum suction of the suction holes 313.

Figure 3D:
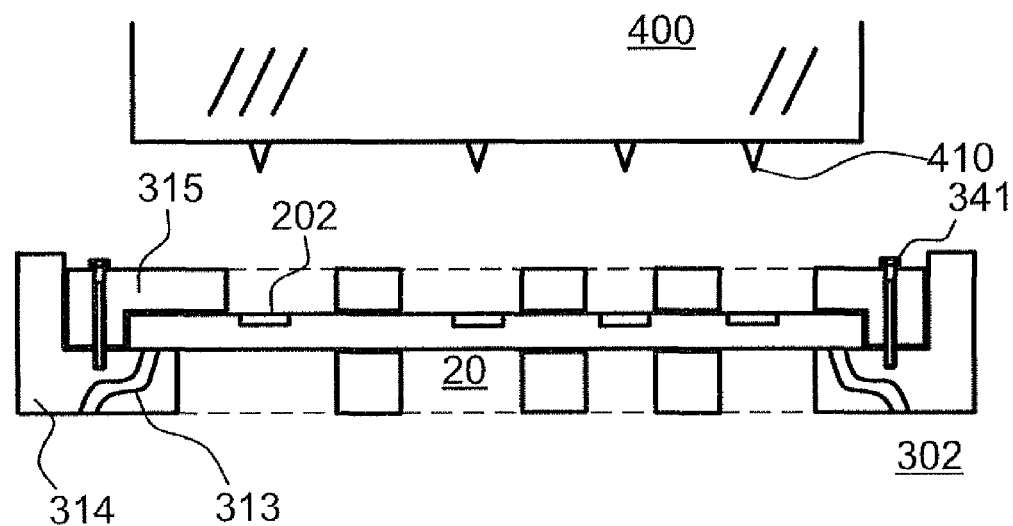

Moreover, as shown in the sectional view diagram of FIG. 3D, which depicts another clamp system 302 employed in the present invention for clamping the thin substrate. The clamp system 302 comprises a lower holding plate 314, an upper holding plate 315 and fixing screws 341. The difference from the clamp system 301 shown in FIG. 3C is that the lower holding plate 314 and the upper holding plate 315 is not a set of holding plates like the lower holding plate 311 and the upper holding plate 312 which are completely hollow to reveal the thin substrate 20. The lower holding plate 314 and the upper holding plate 315 still remain the holding plate portions at the cutting areas, solder mask covering areas and other null areas for test of the thin substrate 20 but merely revealing the areas required for test to the thin substrate 20. The lower holding plate 314 also can comprise the suction holes 313. The thin substrate 20 between the lower holding plate 311 and the upper holding plate 312 can be firmly fixed further with vacuum suction of the suction holes 313.

Although a circular shape is illustrated for the clamping system as shown in FIG. 3A to FIG. 3D of the present invention, the present invention is not limited thereto. The shape of the clamp system according to the present invention can be manufactured depending on the required shape of the thin substrate. The shape can be oblong shape or rectangle and the present invention does not have any limitation.

Figure 4:
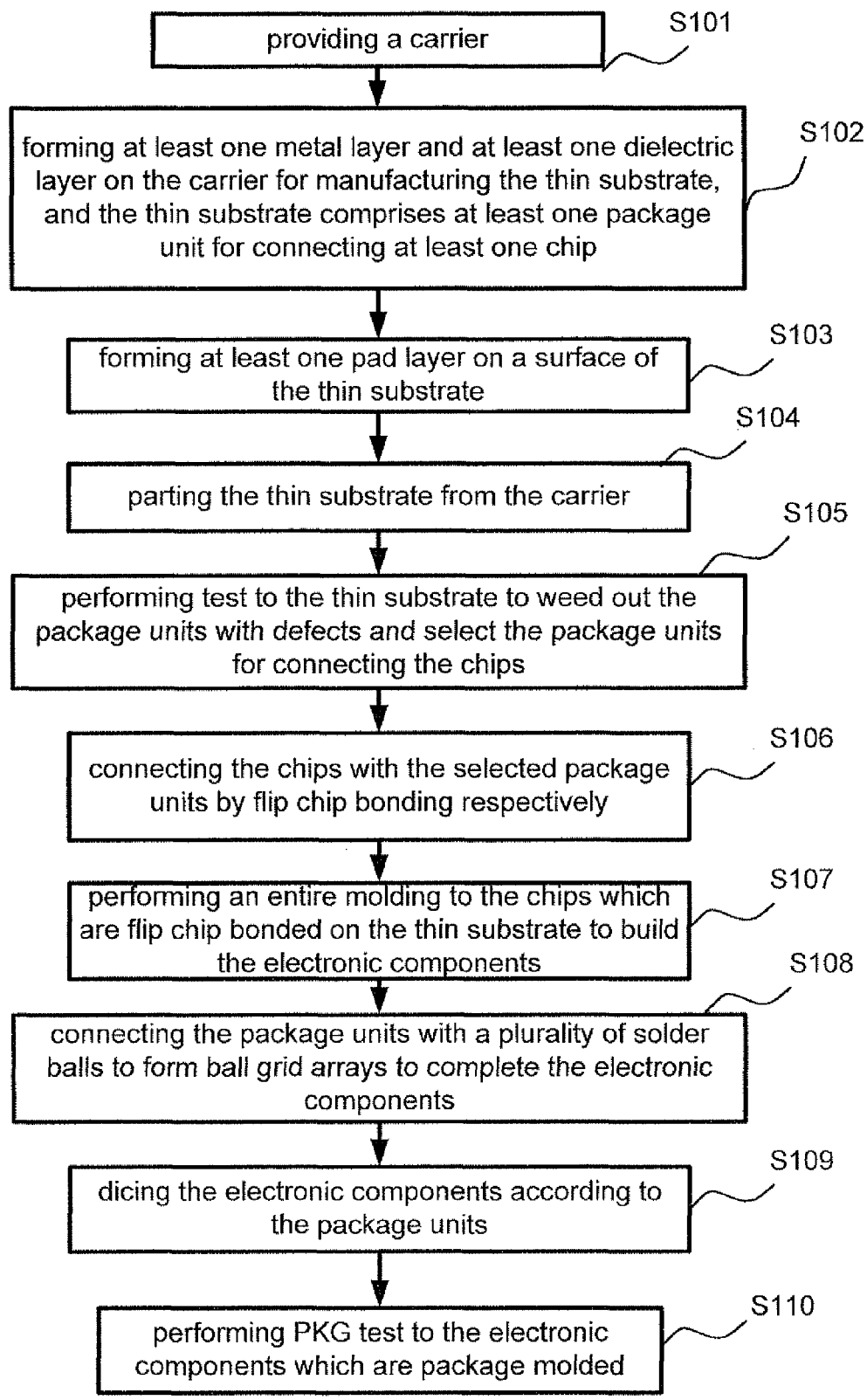
FIG. 4 depicts a flowchart of a package method of thin substrate according to the first embodiment of the present invention.

Please refer to FIG. 2A to FIG. 2D, FIG. 3A to FIG. 3D and FIG. 4. FIG. 4 depicts a flowchart of a package method for electronic components by a thin substrate according to the first embodiment of the present invention. The package method mainly comprises two portions, bare die bonding and component bonding. The bare die bonding can employ Flip Chip Bonding or Wire Bonding as illustrations. The component bonding can employ Surface Mounting Tech., Thin Small Outline Package, Quad Flat No leads, Ball Grid Array as illustrations.

Figure 1D:
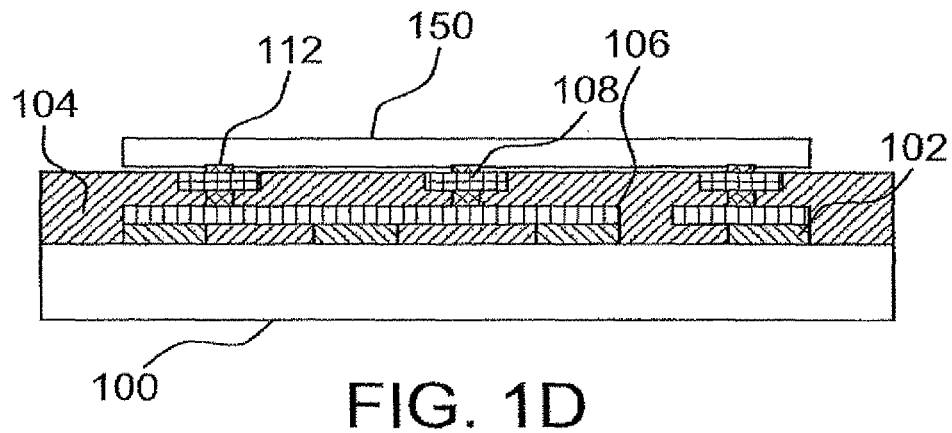

Hereafter, detail descriptions for respective steps of the package method for electronic components by a thin substrate according to the present invention are conducted:

Step S101, as shown in FIG. 2A, providing a carrier 200;

Step S102, as shown in FIG. 2B, forming at least one metal layer and at least one dielectric layer on the carrier 200, In this embodiment of the present invention, forming a plurality of metal layers 202, 206 and a plurality of dielectric layers 204 alternately on the carrier 200 for manufacturing the thin multi-layer substrate. The dielectric layers 204 can be formed with polyimide by spin coating method as an illustration. The metal layers 202, 206 can be formed by a metal lift off process as an illustration. The thin substrate comprises at least one package unit for connecting at least one chip. The amount of the chips connected by the thin substrate (one package unit) can be one or more. The multiple chips connection can be 2D flat multi chip module or 3D stacking connection as illustrations. In this embodiment, the single chip connection is illustrated for explanation;

Step S103, as shown in FIG. 2C, forming a plurality of pad layers 210 on a surface of the thin substrate. A package unit shown in FIG. 2A-FIG. 2D can be employed to connect a chip (a bare die) 150 through the pad layers 210 as by MBB (micro bump bonding) shown in FIG. 1D;

Step S104, as shown in FIG. 2D, parting the thin substrate 20 from the carrier 100;

Step S105, as shown in FIG. 3A to FIG. 3D, the thin substrate 20 comprises a plurality of package units and performing test to each of the package units of the thin substrate 20 to weed out the package units with defects in the plurality of package units and select the package units for connecting the chips;

Step S106, connecting the chips with the selected package units by flip chip bonding respectively through the pad layers (ball pad) as proceeding the flip chip bonding for the chips to prevent connecting good IC chips on the packages with detect according to the test. The aforesaid flip chip bonding has higher package density. Gold bump flip chip bonding or copper pillar flip chip bonding can be selected. The gold bump flip chip bonding or gold stud bump flip chip bonding can be proceed without flux and the connecting temperature is low (130 degree Celsius-200 degree Celsius) and hardly cause deformation of the flexible thin substrate. The copper pillar flip chip bonding requires printing flux and is also adequate for the present invention;

Step S107, performing an entire molding (Wafer Level Compression Molding) to the chips which are flip chip bonded on the thin substrate to build the electronic components. The electronic components in the present invention can be defined as the chips connected with the thin substrate, molded and also can be a ball grid array package component attached on the thin substrate further according to a general idea of this field of arts. In this embodiment of the present invention, the molding of this step is the package molding for making the IC chips as products.

Step S108, proceeding ball grid mounting to the metal layers 202 shown in FIG. 2D on the opposite surface of the thin substrate with pad layers (ball pads) to complete the electronic components of the present invention. The ball grid mounting is to connect the package units with at least one solder balls respectively to form ball grid arrays, i.e. the BGA package (ball grid array package) or to connect the package units with an external ball grid array package component. In this step, the package skill of the aforesaid solder ball bonding or the component bonding has lower package density and printing flux or solder paste is necessary before package. In this embodiment, the ball grid array of solder balls are connected at the opposite surface of the thin substrate (the package units) where the chips (bare dies) are packaged by flip chip bonding but not limited thereto. According to the present invention, the bare die bonding is implemented and then the solder ball bonding is also proceeded on the same surface. Furthermore, the solder ball bonding can be implemented first and then the bare die bonding is proceeded. Alternatively, the bare die bonding and the solder ball bonding can be implemented at the same time.

The aforesaid ball grid array package component connected with the package units also can have structure variations hereafter. According to the present invention, the ball grid array package component can be connected at the same surface of the thin substrate (the package units) where the chips (bare dies) are packaged by flip chip bonding. Alternatively, the bare die bonding is implemented first and then connection of the ball grid array package component is proceeded on different surfaces. Moreover, the connection of the ball grid array package component is implemented first and then the bare die bonding is proceeded. Alternatively, the bare die bonding and the connection of the ball grid array package component can be implemented at the same time.

Step S109, dicing the electronic components according to sizes of the package units (package molding) to make the IC chips as products;

Step S110, performing PKG test to the electronic components which are package molded. The PKG test is a final test for the IC chip products.

Figure 5:
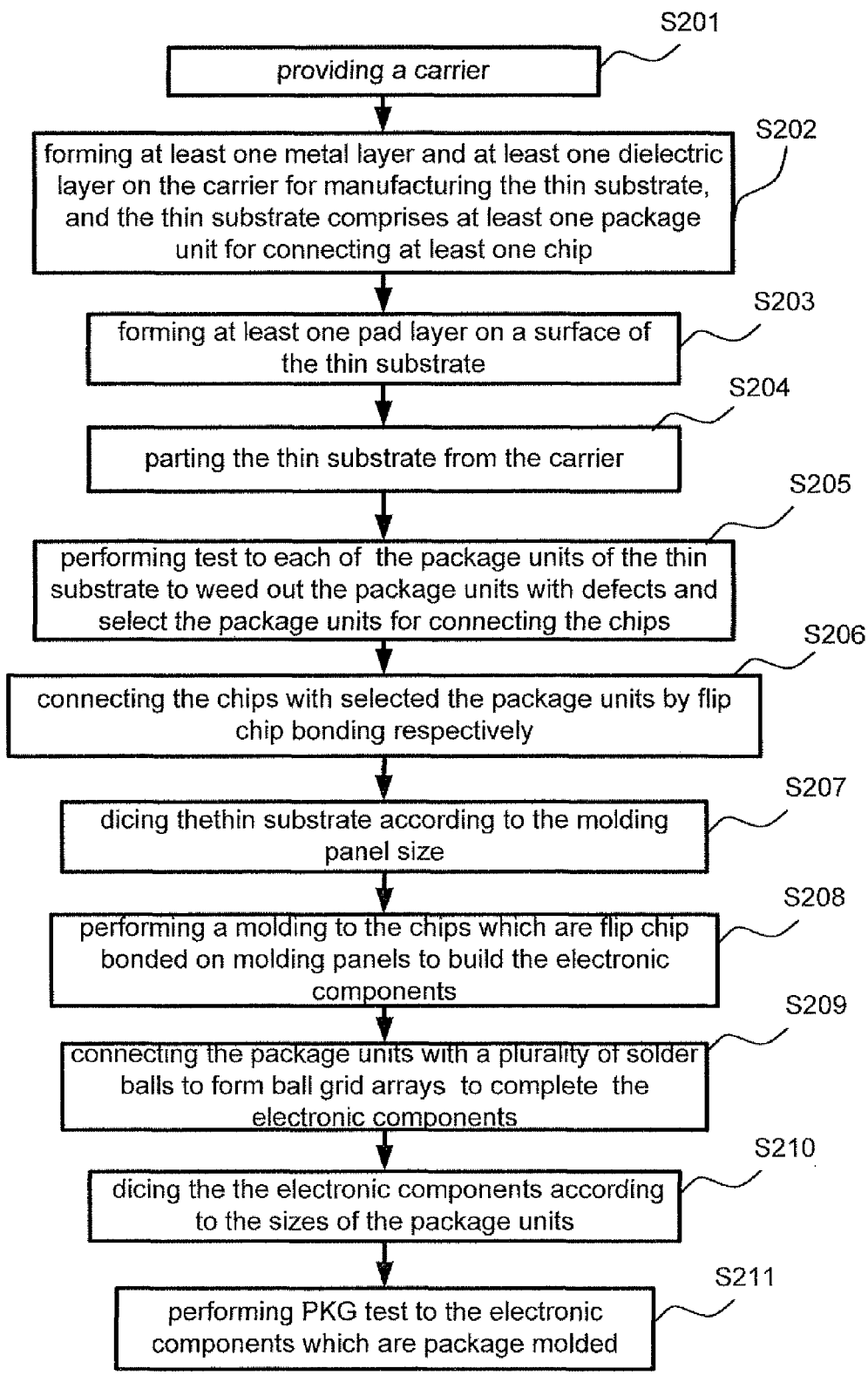
FIG. 5 depicts a flowchart of a package method of thin substrate according to the second embodiment of the present invention.

Please refer to FIG. 2A to FIG. 2D, FIG. 3A to FIG. 3D and FIG. 5. FIG. 5 depicts a flowchart of a package method for electronic components by a thin substrate according to the second embodiment of the present invention. The bare die bonding can employ Flip Chip Bonding or Wire Bonding as illustrations. The component bonding can employ Surface Mounting Tech., Thin Small Outline Package, Quad Flat No leads, Ball Grid Array as illustrations.

Figure 1E:
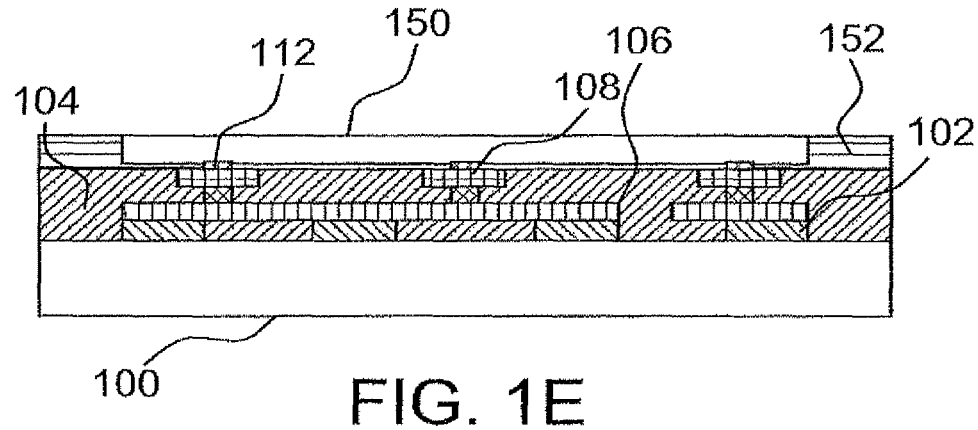
Figure 1F:
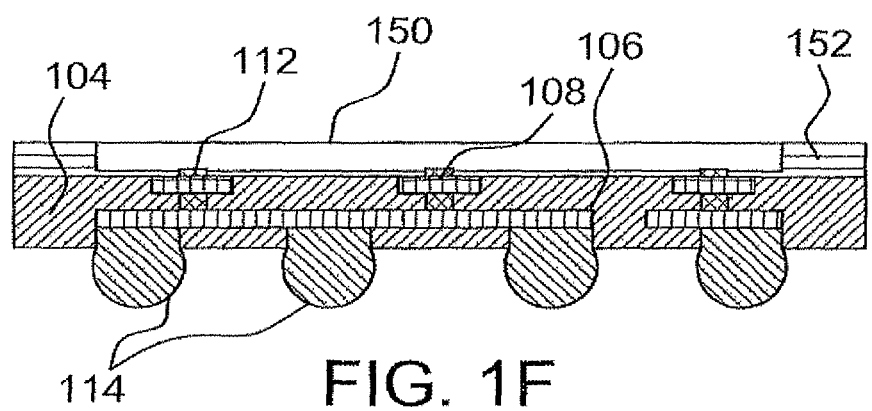

Hereafter, detail descriptions for respective steps of the package method for electronic components by a thin substrate according to the present invention are conducted:

Step S201, as shown in FIG. 2A, providing a carrier 200;

Step S202, as shown in FIG. 2B, forming at least one metal layer and at least one dielectric layer on the carrier 200, In this embodiment of the present invention, forming a plurality of metal layers 202, 206 and a plurality of dielectric layers 204 alternately on the carrier 200 for manufacturing the thin multi-layer substrate. The dielectric layers 204 can be formed with polyimide by spin coating method as an illustration. The metal layers 202, 206 can be formed with copper by a metal lift off process as an illustration. The thin substrate comprises at least one package unit for connecting at least one chip. The amount of the chips connected by the thin substrate (one package unit) can be one or more. The multiple chips connection can be 2D flat multi chip module or 3D stacking connection as illustrations. In this embodiment, the single chip connection is illustrated for explanation;

Step S203, as shown in FIG. 2C, forming at least one pad layers 210 on a surface of the thin substrate. A package unit shown in FIG. 2A-FIG. 2D can be employed to connect a chip (a bare die) 150 through the pad layers 210 as by MBB (micro bump bonding) shown in FIG. 1D;

Step S204, as shown in FIG. 2D, parting the thin substrate 20 from the carrier 100. On single layer thickness of the thin multi-layer substrate 20 of the present invention can be smaller than 20 μm and even smaller than 10 μm. All the dielectric layers are formed by the same material and the stress consistency among respective layers of the substrate is well. Therefore, the issue that warpage of the thin substrate 20 happens after being parted from the carrier 100 can be better prevented;

Step S205, as shown in FIG. 3A to FIG. 3D, the thin substrate 20 comprises a plurality of package units and performing test to each of the package units of the thin substrate 20 to weed out the package units with defects in the plurality of package units and select the package units for connecting the chips;

Step S206, connecting the chips with the selected package units by flip chip bonding respectively as proceeding the flip chip bonding for the chips. The aforesaid flip chip bonding has higher package density. Gold bump flip chip bonding or copper pillar flip chip bonding can be selected. The gold bump flip chip bonding or gold stud bump flip chip bonding can be proceed without flux and the connecting temperature is low (130 degree Celsius-200 degree Celsius) and hardly cause deformation of the flexible, thin substrate. The copper pillar flip chip bonding requires printing flux and is also adequate for the present invention;

Step S207, dicing the thin substrate, i.e. dicing the electronic components in the present invention according to the molding panel size. Please refer to the molding 152 shown in FIG. 1E. In molding, resin material is employed to cover the chips by molding method and an area covered by single molding is different in process, the thin substrate (the electronic components are) is diced (cut) and fixed in a metal frame with a specific size in the present invention. The metal frame is so called a molding panel. The area of the metal frame is the size of the mold panel. In accordance with different molding process, there are different restrictions for the sizes of the molding templates and therefore, the sizes of the molding panels are different, either.

Step S208, performing a molding to the chips which are flip chip bonded on molding panels to build the electronic components. In this step, the present invention utilizes transfer molding and this molding is the package molding for making the IC chips as products. In comparison with the wafer level package in prior arts, one time molding (wafer level compression molding) with wafer size is employed. As considering of a flexible substrate, and particularly of a thin substrate, the warpage issues may easily happens in such molding. Beside, the molding resin with a large area also may easily has warpage issues and results in package body distorts and worthlessness. The present invention provides molding panels and employs the transfer molding with high accuracy. Therefore, the warpage can be controlled within a very small range. Generally, the warpage of the thin substrate is controlled within 60~500 μm, and preferably controlled within 10~300 μm.

Step S209, proceeding ball grid mounting to the metal layers 202 shown in FIG. 2D on the opposite surface of the thin substrate with pad layers (ball pads) to complete the electronic components of the present invention. The ball grid mounting is to connect the package units with at least one solder balls respectively to form ball grid arrays, i.e. the BGA package (ball grid array package) or to connect the package units with an external ball grid array package component. In this step, the package skill of the aforesaid solder ball bonding or the component bonding has lower package density and printing flux or solder paste is necessary before package. In this embodiment, the ball grid array of solder balls are connected at the opposite surface of the thin substrate (the package units) where the chips (bare dies) are packaged by flip chip bonding but not limited thereto. According to the present invention, the bare die bonding is implemented and then the solder ball bonding is also proceeded on the same surface. Furthermore, the solder ball bonding can be implemented first and then the bare die bonding is proceeded. Alternatively, the bare die bonding and the solder ball bonding can be implemented at the same time.

The aforesaid ball grid array package component connected with the package units also can have structure variations hereafter. According to the present invention, the ball grid array package component can be connected at the same surface of the thin substrate (the package units) where the chips (bare dies) are packaged by flip chip bonding. Alternatively, the bare die bonding is implemented first and then connection of the ball grid array package component is proceeded on different surfaces. Moreover, the connection of the ball grid array package component is implemented first and then the bare die bonding is proceeded. Alternatively, the bare die bonding and the connection of the ball grid array package component can be implemented at the same time.

Step S210, dicing the molding panel, i.e. dicing the electronic components according to the sizes of the respective package units of the chips;

Step S211, performing PKG test to the electronic components which are package molded. The PKG test is a final test for the IC chip products.

Figure 6:
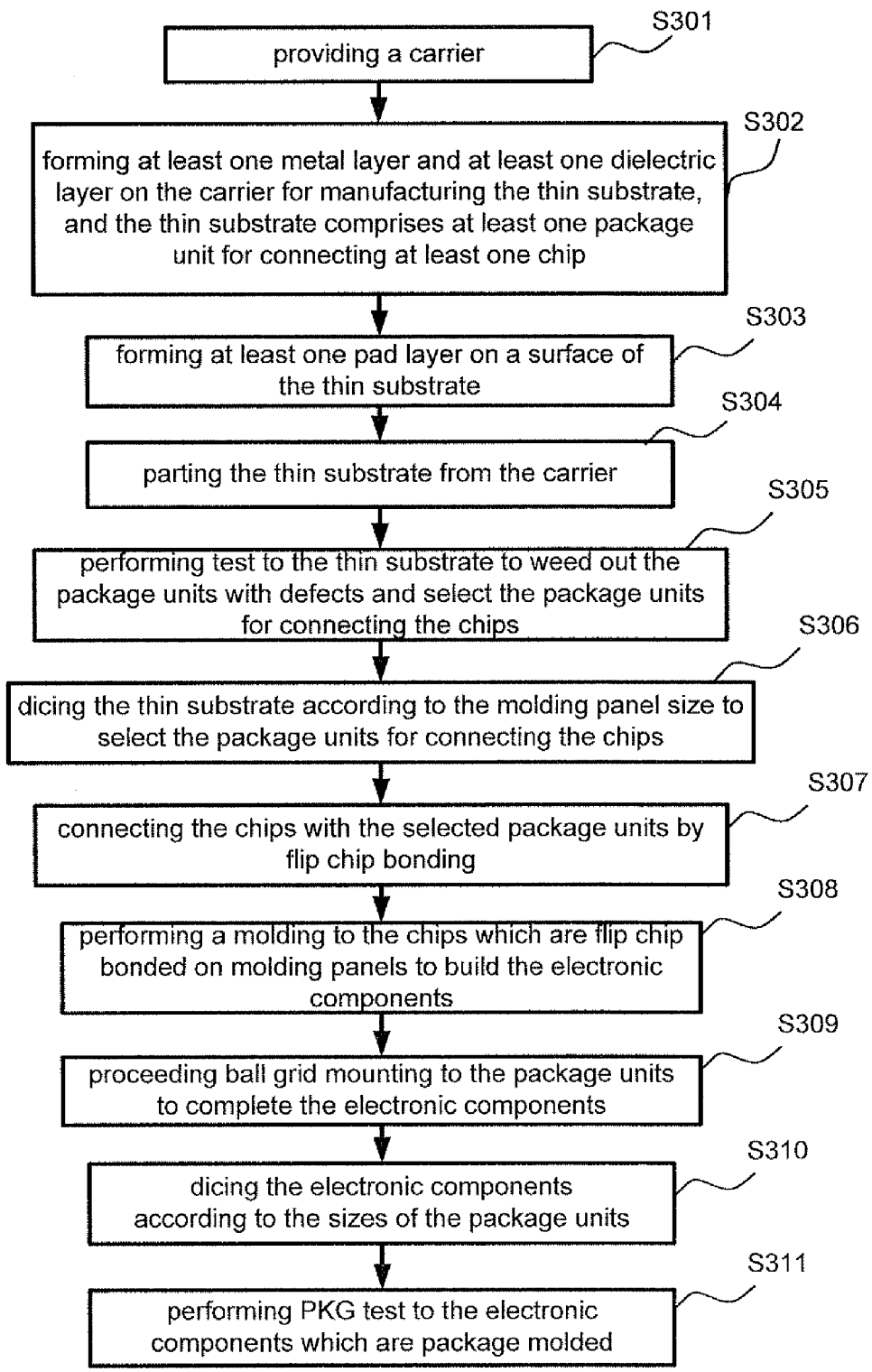
FIG. 6 depicts a flowchart of a package method of thin substrate according to the third embodiment of the present invention.

Please refer to FIG. 2A to FIG. 2D, FIG. 3A to FIG. 3D and FIG. 6. FIG. 6 depicts a flowchart of a package method for electronic components by a thin substrate according to the third embodiment of the present invention. The bare die bonding can employ Flip Chip Bonding or Wire Bonding as illustrations. The component bonding can employ Surface Mounting Tech., Thin Small Outline Package, Quad Flat No leads, Ball Grid Array as illustrations.

Hereafter, detail descriptions for respective steps of the package method for electronic components by a thin substrate according to the present invention are conducted:

Step S301, as shown in FIG. 2A, providing a carrier 200;

Step S302, as shown in FIG. 2B, at least one metal layer and at least one dielectric layer are formed on the carrier 200, In this embodiment of the present invention, forming a plurality of metal layers 202, 206 and a plurality of dielectric layers 204 alternately on the carrier 200 for manufacturing the thin multi-layer substrate. The dielectric layers 204 can be formed by spin coating method as an illustration. The metal layers 202, 206 can be formed by a metal lift off process as an illustration. The thin substrate comprises at least one package unit for connecting at least one chip. The amount of the chips connected by the thin substrate (one package unit) can be one or more. The multiple chips connection can be 2D flat multi chip module or 3D stacking connection as illustrations. In this embodiment, the single chip connection is illustrated for explanation;

Step S303, as shown in FIG. 2C, forming at least one pad layers 210 on a surface of the thin substrate. A package unit shown in FIG. 2A-FIG. 2D can be employed to connect a chip (a bare die) 150 through the pad layers 210 as by MBB (micro bump bonding) shown in FIG. 1D;

Step S304, as shown in FIG. 2D, parting the thin substrate 20 from the carrier 100. On single layer thickness of the thin substrate 20 of the present invention can be smaller than 20 µm and even smaller than 10 µm. All the dielectric layers are formed by the same material and the stress consistency among respective layers of the substrate is well. Therefore, the issue that warpage of the thin substrate 20 happens after being parted from the carrier 100 can be better prevented;

Step S305, as shown in FIG. 3A to FIG. 3D, the thin substrate 20 comprises a plurality of package units and performing test to each of the package units of the thin substrate 20 to weed out the package units with defects in the plurality of package units and select the package units for connecting the chips;

Step S306, in this step of the embodiment according to the present invention, dicing the thin substrate according to the molding panel size to select the package units for connecting the chips;

Step S307, connecting the chips with the selected package units by flip chip bonding respectively as proceeding the flip chip bonding for the chips. The aforesaid flip chip bonding has higher package density. Gold bump flip chip bonding or copper pillar flip chip bonding can be selected. The gold bump flip chip bonding or gold stud bump flip chip bonding can be proceed without flux and the connecting temperature is low (130 degree Celsius-200 degree Celsius) and hardly cause deformation of the flexible thin substrate. The copper pillar flip chip bonding requires printing flux and is also adequate for the present invention;

Step S308, performing a molding to the chips which are flip chip bonded on molding panels to build the electronic components. In this step, a transfer molding is employed in the present invention. The molding of this step is the package molding for making the IC chips as products. In comparison with the wafer level package in prior arts, one time molding (wafer level compression molding) with wafer size is employed. As considering of a flexible substrate, and particularly of a thin substrate, the warpage issue easily happens in such molding. The present invention employs the transfer molding with high accuracy. Therefore, the warpage can be controlled within a very small range.

Step S309, proceeding ball grid mounting to the metal layers 202 shown in FIG. 2D on the opposite surface of the thin substrate with pad layers (ball pads) to complete the electronic components of the present invention. The ball grid mounting is to connect the package units with at least one solder balls respectively to form ball grid arrays, i.e. the BGA package (ball grid array package) or to connect the package units with an external ball grid array package component. In this step, the package skill of the aforesaid solder ball bonding or the component bonding has lower package density and printing flux or solder paste is necessary before package. In this embodiment, the ball grid array of solder balls are connected at the opposite surface of the thin substrate (the package units) where the chips (bare dies) are packaged by flip chip bonding but not limited thereto. According to the present invention, the bare die bonding is implemented and then the solder ball bonding is also proceeded on the same surface. Furthermore, the solder ball bonding can be implemented first and then the bare die bonding is proceeded. Alternatively, the bare die bonding and the solder ball bonding can be implemented at the same time.

The aforesaid ball grid array package component connected with the package units also can have structure variations hereafter. According to the present invention, the ball grid array package component can be connected at the same surface of the thin substrate (the package units) where the chips (bare dies) are packaged by flip chip bonding. Alternatively, the bare die bonding is implemented first and then connection of the ball grid array package component is proceeded on different surfaces. Moreover, the connection of the ball grid array package component is implemented first and then the bare die bonding is proceeded. Alternatively, the bare die bonding and the connection of the ball grid array package component can be implemented at the same time;

Step S310, dicing the molding panel, i.e. dicing the electronic components in the present invention according to the sizes of the respective package units of the chips;

Step S311, performing PKG test to the electronic components which are package molded. The PKG test is a final test for the IC chip products.

Figure 7:
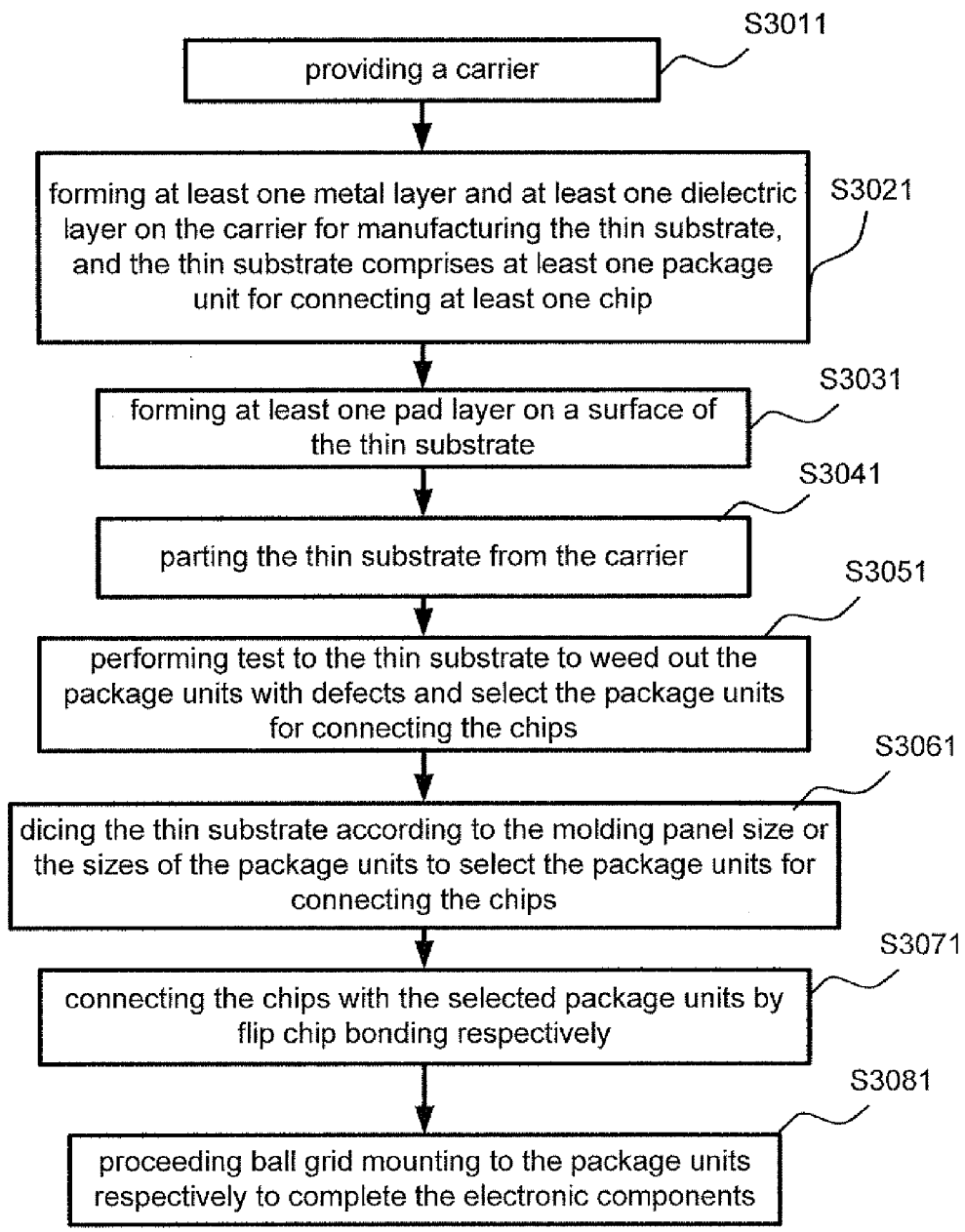
FIG. 7 depicts a flowchart of a package method of thin substrate according to the fourth embodiment of the present invention.

Please refer to FIG. 2A to FIG. 2D, FIG. 3A to FIG. 3D and FIG. 7. FIG. 7 depicts a flowchart of a package method for electronic components by a thin substrate according to the fourth embodiment of the present invention. The bare die bonding can employ Flip Chip Bonding or Wire Bonding as illustrations. The component bonding can employ Surface Mounting Tech., Thin Small Outline Package, Quad Flat No leads, Ball Grid Array as illustrations.

Hereafter, detail descriptions for respective steps of the package method for electronic components by a thin substrate according to the present invention are conducted:

Step S3011, as shown in FIG. 2A, providing a carrier 200;

Step S3021, as shown in FIG. 2B, forming at least one metal layer and at least one dielectric layer on the carrier 200, In this embodiment of the present invention, forming a plurality of metal layers 202, 206 and a plurality of dielectric layers 204 alternately on the carrier 200 for manufacturing the thin multi-layer substrate. The dielectric layers 204 can be formed by spin coating method as an illustration. The metal layers 202, 206 can be formed by a metal lift off process as an illustration. The thin substrate comprises at least one package unit for connecting at least one chip. The amount of the chips connected by the thin substrate (one package unit) can be one or more. The multiple chips connection can be 2D flat multi chip module or 3D stacking connection as illustrations. In this embodiment, the single chip connection is illustrated for explanation;

Step S3031, as shown in FIG. 2C, forming at least one pad layers 210 on a surface of the thin substrate. A package unit shown in FIG. 2A-FIG. 2D can be employed to connect a chip (a bare die) 150 through the pad layers 210 as by MBB (micro bump bonding) shown in FIG. 1D;

Step S3041, as shown in FIG. 2D, parting the thin substrate 20 from the carrier 100. On single layer thickness of the thin substrate 20 of the present invention can be smaller than 20 μm and even smaller than 10 μm. All the dielectric layers are formed by the same material and the stress consistency among respective layers of the substrate is well. Therefore, the issue that warpage of the thin substrate 20 happens after being parted from the carrier 100 can be better prevented;

Step S3051, as shown in FIG. 3A to FIG. 3D, the thin substrate 20 comprises a plurality of package units and performing test to each of the package units of the thin substrate 20 to weed out the package units with defects in the plurality of package units and select the package units for connecting the chips;

Step S3061, dicing the thin substrate according to the molding panel size or the sizes of the package units to select the package units for connecting the chips. In this embodiment of the present invention, several options can be provided for this step. This step can be omitted after Step S3051 and then Step S3071 is proceeded. Alternatively, this Step S3061 can be implemented after proceeding Step S3081.

Step S3071, connecting the chips with the selected package units by flip chip bonding respectively as proceeding the flip chip bonding for the chips. The aforesaid flip chip bonding has higher package density. Gold bump flip chip bonding or copper pillar flip chip bonding can be selected. The gold bump flip chip bonding or gold stud bump flip chip bonding can be proceed without flux and the connecting temperature is low (130 degree Celsius-200 degree Celsius) and hardly cause deformation of the flexible thin substrate. The copper pillar flip chip bonding requires printing flux and is also adequate for the present invention;

Step S3081, proceeding ball grid mounting to the package units respectively. The ball grid mounting is to connect the package units with at least one solder balls respectively to form ball grid arrays, i.e. the BGA package (ball grid array package) to complete the electronic components of the present invention. In this step, the package skill of the aforesaid solder ball bonding has lower package density and printing flux or solder paste is necessary before package. In this embodiment, the ball grid array of solder balls are connected at the opposite surface of the thin substrate (the package units) where the chips (bare dies) are packaged by flip chip bonding.

Figure 8:
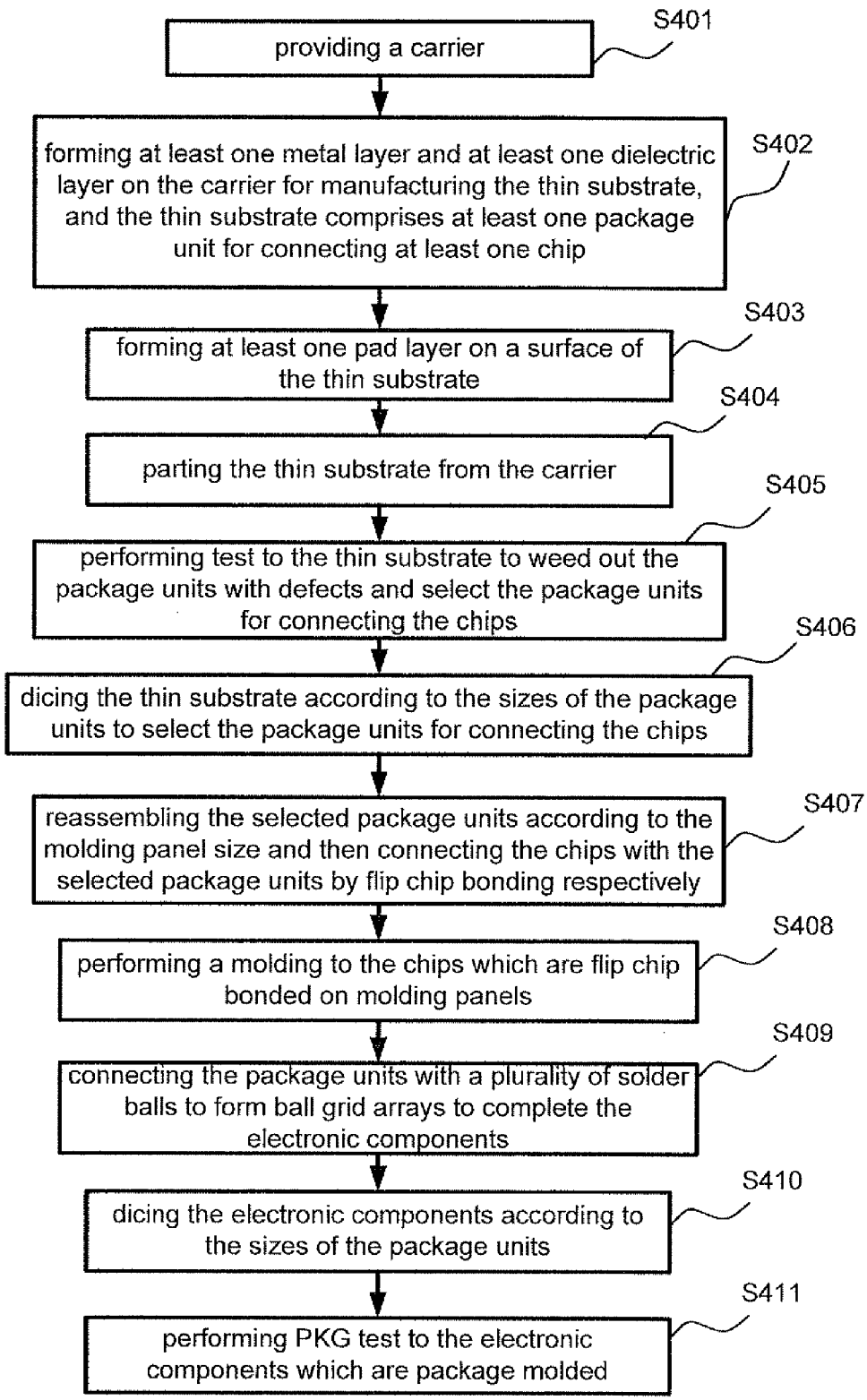
FIG. 8 depicts a flowchart of a package method of thin substrate according to the fifth embodiment of the present invention.

Please refer to FIG. 2A to FIG. 2D, FIG. 3A to FIG. 3D and FIG. 8. FIG. 8 depicts a flowchart of a package method for electronic components by a thin substrate according to the fifth embodiment of the present invention. The bare die bonding can employ Flip Chip Bonding or Wire Bonding as illustrations. The component bonding can employ Surface Mounting Tech., Thin Small Outline Package, Quad Flat No leads, Ball Grid Array as illustrations.

Hereafter, detail descriptions for respective steps of the package method for electronic components by a thin substrate according to the present invention are conducted:

Step S401, as shown in FIG. 2A, providing a carrier 200;

Step S402, as shown in FIG. 2B, forming at least one metal layer and at least one dielectric layer on the carrier 200, In this embodiment of the present invention, forming a plurality of metal layers 202, 206 and a plurality of dielectric layers 204 alternately on the carrier 200 for manufacturing the thin multi-layer substrate. The dielectric layers 204 can be formed by spin coating method as an illustration. The metal layers 202, 206 can be formed by a metal lift off process as an illustration. The thin substrate comprises at least one package unit for connecting at least one chip. The amount of the chips connected by the thin substrate (one package unit) can be one or more. The multiple chips connection can be 2D flat multi chip module or 3D stacking connection as illustrations. In this embodiment, the single chip connection is illustrated for explanation;

Step S403, as shown in FIG. 2C, forming at least one pad layers 210 on a surface of the thin substrate. A package unit can be employed to connect a chip (a bare die) 150 through the pad layers 210 as by MBB (micro bump bonding) shown in FIG. 1D;

Step S404, as shown in FIG. 2D, parting the thin substrate 20 from the carrier 100. On single layer thickness of the thin substrate 20 of the present invention can be smaller than 20 μm and even smaller than 10 μm. All the dielectric layers are formed by the same material and the stress consistency among respective layers of the substrate is well. Therefore, the issue that warpage of the thin substrate 20 happens after being parted from the carrier 100 can be better prevented;

Step S405, as shown in FIG. 3A to FIG. 3D, the thin substrate 20 comprises a plurality of package units and performing test to each of the package units of the thin substrate 20 to weed out the package units with defects in the plurality of package units and select the package units for connecting the chips;

Step S406, dicing the thin substrate according to the sizes of the package units to select the package units for connecting the chips;

Step S407, reassembling the selected package units according to the molding panel size (i.e. the sizes of the package units) and then connecting the chips with the selected package units by flip chip bonding respectively. The procedure that the selected package units are attached on a heat-resistant adhesive tape or on a metal plate that glue is spread on the surface thereof can be illustrated for the reassembling. The aforesaid re-assembly is employed for the following steps. The aforesaid flip chip bonding has higher package density. Gold bump flip chip bonding or copper pillar flip chip bonding can be selected. The gold bump flip chip bonding or gold stud bump flip chip bonding can be proceed without flux and the connecting temperature is low (130 degree Celsius-200 degree Celsius) and hardly cause deformation of the flexible thin substrate. The copper pillar flip chip bonding requires printing flux and is also adequate for the present invention;

Step S408, performing a molding to the chips which are flip chip bonded on molding panels to build the electronic components. In this step, the present invention utilizes transfer molding and this molding is the package molding for making the IC chips as products. The present invention employs the transfer molding with high accuracy. Therefore, the warpage issue which easily happens to a flexible substrate, and more particularly to a thin substrate can be effectively controlled.

Step S409, proceeding ball grid mounting to the metal layers 202 shown in FIG. 2D on the opposite surface of the thin substrate with pad layers (ball pads) to complete the electronic components of the present invention. The ball grid mounting is to connect the package units with at least one solder balls respectively to form ball grid arrays, i.e. the BGA package (ball grid array package) or to connect the package units with an external ball grid array package component. Before this step, an optional procedure that the molded chips with the thin substrate are departed from the heat-resistant adhesive tape or the metal plate can be executed. In this step, the package skill of the aforesaid solder ball bonding or the component bonding has lower package density and printing flux or solder paste is necessary before package. In this embodiment, the ball grid array of solder balls are connected at the opposite surface of the thin substrate (the package units) where the chips (bare dies) are packaged by flip chip bonding but not limited thereto. According to the present invention, the bare die bonding is implemented and then the solder ball bonding is also proceeded on the same surface. Furthermore, the solder ball bonding can be implemented first and then the bare die bonding is proceeded. Alternatively, the bare die bonding and the solder ball bonding can be implemented at the same time.

The aforesaid ball grid array package component connected with the package units also can have structure variations hereafter. According to the present invention, the ball grid array package component can be connected at the same surface of the thin substrate (the package units) where the chips (bare dies) are packaged by flip chip bonding. Alternatively, the bare die bonding is implemented first and then connection of the ball grid array package component is proceeded on different surfaces. Moreover, the connection of the ball grid array package component is implemented first and then the bare die bonding is proceeded. Alternatively, the bare die bonding and the connection of the ball grid array package component can be implemented at the same time;

Step S410, dicing the molding panel, i.e. dicing the electronic components in the present invention according to the sizes of the respective package units of the chips;

Step S411, performing PKG test to the electronic components which are package molded. The PKG test is a final test for the IC chip products.

As aforementioned, the yield of the entire package process depends on the sum of the yields of respective components. However, under the condition that the complexity and integration of the thin substrate becomes higher, the possibility of the IC chips with the entire package fail due to the defect occurrence of the thin substrate increase consequently. In the wafer level package according to prior arts, the thin substrate (such as the interpose layer in SMAFTI) is the important component which is a crucial component of connecting and connecting the memory chip and logic chip. However, a pre test to the thin substrate for selection is impossible due to the limitations of the wafer level package according to prior arts. The wafer molding is still implemented to the whole silicon wafer first and dice or singulation is performed, then the IC chips with qualified package can be selected with the test. In the considerations of the costs, the manufacture cost of the thin substrate is merely ⅓ of the manufacture cost of the package molding and ¹/₁₀ of the 1C chip. However, the cost needs to be paid does not only include the manufacture of the thin substrate if the IC chip with entire completed package fails due to the defect occurrence of the thin substrate. Consequently, there is a need to improve the yield of the entire package related with the wafer level package process and to effectively reduce the pointless manufacture material cost further.

Furthermore, the sequence of implementing the aforementioned bare die bonding and the component bonding does not have specific restrictions. Generally, the bare die bonding is implemented before the component bonding. The reason is that most skills of the bare die bonding are irreversible package process and desolder does not happen due to the heating up in the following process. As aforementioned, printing flux or solder paste is necessary before the component bonding package. In case that the bare die bonding and the component bonding are implemented on the same surface of the thin substrate, 3D solder paste printing needs to be implemented for avoiding the bare dies which are completely packaged. The 3D solder paste printing utilizes a three-dimensional printing plate capable of covering the bare dies to prevent the printing solder paste for the component bonding to contact the bare dies which have been completely packaged. In condition that the package density is low enough, the component bonding also can be implemented before the bare die bonding. The 3D solder paste printing can be omitted and the package process can be simplified. Furthermore, the bare die bonding and the component bonding can be implemented at the same time in one reflow process if the solder bumps or the copper pillar bumps with solder on tops are employed for the bare die bonding. That's is: the bare die and the element can be put on the thin substrate (not connected or not bonding yet) and with only one reflow process, the bare die and the element can be bonded (connected) on the thin substrate. The package method can be simplified and the package efficiency can be improved.

Moreover, in all package processes in all the aforesaid embodiments, the method of fixing the thin substrate can employ the clamp systems 3400-302 shown in FIG. 3A to FIG. 3D. In package processes, the requirements of fixing the thin substrate are not as strict as the contact resistance, the tension and etc. in performing test. As long as the thin substrate is fixed well for performing the package processes.

In conclusion, the pre test to the thin substrate can be achieved after the thin substrate is manufactured and parted from the carrier (silicon wafer). According to the present invention, the skill characteristic of perfect yield is comprised and the flexible arrangement for the test and the packages is significantly different from the wafer level package of prior arts. Drawbacks due to restrictions of the package process on the silicon wafer can be eliminated. According to the package and test methods of present invention, the package circuit design can be nimbler. Consequently, the present invention provides a total solution for the flexible and thin substrate. The package method and the test method of present invention is not only applicable to the package process nowadays which the complexity and the integration demands are getting strict day by day but also is capable of improving the yield of the entire package of wafer level package and effectively reducing the pointless manufacture material cost.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. A package method for electronic components by a thin substrate, comprising:
   providing a carrier;
   forming at least one metal layer and at least one dielectric layer on the carrier for manufacturing the thin substrate, and the thin substrate comprises at least one package unit for connecting at least one chip;
   forming at least one pad layer on a surface of the thin substrate;
   parting the thin substrate from the carrier;
   performing test to the thin substrate to weed out the package unit with defects in the at least one package unit and select the package units for connecting the chips;
   dicing the thin substrate according to the package units to select the package units for connecting the chips;
   reassembling the selected package units according to a molding panel size and connecting the chips with the selected package units by flip chip bonding respectively; and
   performing a molding to the chips which are flip chip bonded on the thin substrate to build the electronic components.

2. The package method of the thin substrate according to claim 1, further comprising a step of clamping the thin substrate with a clamp system to reveal the pad layers on a top surface and a bottom surface of the thin substrate simultaneously for test during the step of performing test to the thin substrate.

3. The package method according to claim 2, further comprising a step of controlling a tension to the thin substrate and a contact resistance of the thin substrate within predetermined values during the step of clamping the thin substrate.

4. The package method according to claim 1, wherein the package units are connected to the chips through the pad layers by flip chip bonding.

5. The package method of a thin substrate according to claim 1, wherein the molding is transfer molding.

6. The package method according to claim 1 further comprising a step of connecting the package units with a plurality of solder balls to form ball grid arrays and complete the electronic component after the step of performing the molding.

7. The package method according to claim 5, further comprising a step of dicing the electronic components according to the package units after the step of forming the ball grid arrays.

8. The package method according to claim 7, further comprising a step of performing test to the electronic components respectively after the step of dicing the electronic components.

9. The package method according to claim 1, further comprising a step of connecting each of the package units with a ball grid array package component before the step of performing the molding and this step is implemented on the same surface of the package units where the chips are packaged by flip chip bonding.

10. The package method according to claim 9, further comprising a step of printing flux or solder paste on the package units before the step of connecting each of the package units with a ball grid array package component.

11. The package method according to claim 1, further comprising a step of connecting each of the package units with a ball grid array package component before the step of connecting the chips by flip chip bonding.

12. The package method according to claim 11, wherein the step of connecting each of the package units with a ball grid array package component is implemented on the same surface of the package units where the chips are respectively packaged by flip chip bonding.

13. The package method according to claim 1, further comprising a step of a step of connecting each of the package units with a ball grid array package component during the step of connecting the chips by flip chip bonding and the ball grid array package component is connected on the same surface of the package units where the chips are packaged by flip chip bonding.

14. The package method according to claim 1, wherein the flip chip bonding is implemented with gold bumps during the step of reassembling the selected package units according to a molding panel size and connecting the chips with the selected package units by flip chip bonding respectively.

* * * * *